US008085352B2

United States Patent
Kim et al.

(10) Patent No.: US 8,085,352 B2
(45) Date of Patent: Dec. 27, 2011

(54) ELECTROSTATIC DISCHARGE PROTECTION CIRCUIT, MANUFACTURING METHOD THEREOF AND LIQUID CRYSTAL DISPLAY DEVICE HAVING THE SAME

(75) Inventors: Ju Han Kim, Daegu (KR); Jong Beom Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 572 days.

(21) Appl. No.: 12/289,024

(22) Filed: Oct. 17, 2008

(65) Prior Publication Data
US 2009/0102995 A1 Apr. 23, 2009

(30) Foreign Application Priority Data
Oct. 23, 2007 (KR) .................. 10-2007-0106914

(51) Int. Cl.
*G02F 1/1333* (2006.01)
(52) U.S. Cl. ................ 349/40; 349/43; 349/54
(58) Field of Classification Search ............ 349/43, 349/40, 41, 54, 149, 152, 139; 361/91.5; 438/281; 257/E21.532
See application file for complete search history.

(56) References Cited

U.S. PATENT DOCUMENTS
6,043,971 A * 3/2000 Song et al. ............ 361/111
2006/0023135 A1* 2/2006 Park .................... 349/40
2007/0296881 A1* 12/2007 Choi et al. ............. 349/40
* cited by examiner

*Primary Examiner* — Thoi Duong
(74) *Attorney, Agent, or Firm* — McKenna, Long & Aldridge, LLP (57) ABSTRACT

A width and a length of the electrostatic discharge (ESD) protection circuit are reduced by changing a connection structure of the electrostatic discharge protection circuit. The ESD protection circuit includes a plurality of gate electrodes disposed between odd signal lines and even signal lines adjacent to the odd signal lines among the signal lines; source/drain electrode pairs each disposed on a respective one of the gate electrodes to form a plurality of transistors; and connection nodes parallel to the source/drain electrode pairs, each connection node adjacent to a respective one of the source/drain electrodes pairs and on a respective one of the gate electrodes, wherein each of the connection nodes is directly connected to the source/drain electrode pair of an adjacent transistor and the gate electrode formed below the source/drain electrode through a contact part.

12 Claims, 4 Drawing Sheets

ELECTROSTATIC DISCHARGE PROTECTION CIRCUIT, MANUFACTURING METHOD THEREOF AND LIQUID CRYSTAL DISPLAY DEVICE HAVING THE SAME

This application claims the benefit of Korean Patent Application No. 10-2007-0106914, filed Oct. 23, 2007, which is hereby incorporated by reference in its entirety for all purposes as if fully set forth herein.

BACKGROUND OF THE INVENTION

1. Field of the Invention

The present invention relates to a liquid crystal display device having an electrostatic discharge protection circuit, and a method of manufacturing the same.

2. Discussion of the Related Art

A liquid crystal display (LCD) device is a flat panel display device in which an electric field is applied to liquid crystal molecules having fluidity of liquid and optical characteristics of a crystal to change an optical anisotropy of the liquid crystal molecules. The liquid crystal display device has low power-consumption and a small volume as compared with the conventional cathode ray tube. In addition, the liquid crystal display device can be manufactured in a large size and can display high-definition images. As a result of these advantages, the liquid crystal display device is extensively used.

A typical liquid crystal display device includes a liquid crystal display panel for displaying images and a driving circuit for applying a driving signal to the liquid crystal display panel. The liquid crystal display panel includes a first substrate and a second substrate that are combined with each other while being spaced apart from each other and a liquid crystal layer interposed between the first substrate and the second substrate.

Liquid crystal display devices can have various types of modes depending on characteristics and a pattern structure of the liquid crystal molecules. The liquid crystal display device includes a Twisted Nematic (TN) Mode liquid crystal display device, a Multi-Domain Mode liquid crystal display device, an Optically Compensated Birefringence (OCB) Mode liquid crystal display device, an In-Plane Switching (IPS) Mode liquid crystal display device, and a Vertical Alignment (VA) Mode liquid crystal display device.

In the TN Mode liquid crystal display device, directors of the liquid crystal molecules are aligned such that the directors are twisted in 90 degrees. A voltage is applied to the liquid crystal molecules to control the directors of the liquid crystal molecules.

In the Multi-Domain Mode liquid crystal display device, a pixel is divided into a plurality of domains such that the domains have main viewing angles different from each other, thereby realizing a wide viewing angle.

In the OCB Mode liquid crystal display device, a compensation film is attached to an outer surface of the substrate to compensate for phase variation of light depending on a traveling direction of light.

In the In-Plane Switching Mode liquid crystal display device, two electrodes are formed on a single substrate such that the director of the liquid crystal molecule is twisted on a plane which is parallel to an alignment layer on the substrate.

In the VA mode liquid crystal display device, a major axis of the liquid crystal molecule is aligned perpendicularly to a vertical alignment layer by using a negative type liquid crystal molecule and the vertical alignment layer.

Meanwhile, a plurality of pixel regions arranged in a matrix are defined in the liquid crystal display device by crossings of gate lines for applying the driving signal with data lines for applying a graphic data signal. A pixel electrode and a thin film transistor (hereinafter, referred to as a "TFT") that transfers a data signal applied from the data line, are disposed on each pixel region.

An electrostatic discharge protection circuit is formed in the liquid crystal display devices regardless of the mode of the liquid crystal display device in order to prevent elements and signal lines, such as gate lines, data lines and common voltage lines, from being damaged by static electricity generated from the outside or inside of the LCD device during the manufacturing process or when using the liquid crystal display device. The electrostatic discharge protection circuit is disposed between ends of the common voltage line, to which a common voltage is applied, the gate line and the data line.

However, when the liquid crystal display device is manufactured to have a small size with a high-resolution, the available space for forming the electrostatic discharge protection circuit is reduced, causing a difficulty in designing the electrostatic discharge protection circuit. In particular, since the electrostatic discharge protection circuit is formed by connecting a plurality of transistors to each other, if intervals between the gate lines or the data lines are narrow, a shorting-defect may occur between the lines during the manufacturing process.

Recently, various portable display devices have been extensively used for displaying a moving picture. These portable display devices are manufactured in a small size and require a high-resolution. Accordingly, an electrostatic discharge protection circuit suitable for a narrow space is highly desired.

SUMMARY OF THE INVENTION

Accordingly, the present invention is directed to a liquid crystal display device that substantially obviates one or more of the problems due to limitations and disadvantages of the related art.

An advantage of the present invention is to provide an electrostatic discharge protection circuit, a method of manufacturing the same and a liquid crystal display device having the same, capable of reducing a width and a length of the electrostatic discharge protection circuit by changing a connection structure of the electrostatic discharge protection circuit formed on signal lines including a gate line, a data line and a common voltage line.

Another advantage of the present invention is to provide an electrostatic discharge protection circuit, a method of manufacturing the same and a liquid crystal display device having the same, in which a contact hole is formed in a connection node area of a transistor used for the electrostatic discharge protection circuit so that the connection node area can be directly connected to a source/drain electrode of an adjacent transistor.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an electrostatic discharge protection circuit includes: a plurality of signal lines; a plurality of gate electrodes disposed between odd signal lines and even signal lines adjacent to the odd signal lines among the signal lines;

source/drain electrode pairs each disposed on a respective one of the gate electrodes to form a plurality of transistors; and connection nodes parallel to the source/drain electrode pairs, each connection node adjacent to a respective one of the source/drain electrodes pairs and on a respective one of the gate electrodes, wherein each of the connection nodes is directly connected to the source/drain electrode pair of an adjacent transistor and the gate electrode formed below the source/drain electrode pair through a contact part.

In another aspect of the present invention, a method of manufacturing an electrostatic discharge protection circuit includes: forming a plurality of gate electrodes isolated from each other, wherein the gate electrodes are formed on regions of a plurality of transistors and regions of a plurality of connection nodes; forming a gate insulating layer on the gate electrodes; forming a channel layer on the gate insulating layer; forming a plurality of source/drain electrode pairs each respectively corresponding to one of the gate electrodes on the channel layer in the regions of the plurality of transistors; forming a protection layer on the substrate and then patterning the protection layer to expose the source/drain electrode pairs at the regions of the plurality of the connection nodes; and forming a plurality of contact parts in the regions of the plurality of connection nodes such that the source/drain electrode pair and the gate electrodes are electrically connected through the plurality of contact parts.

In yet another aspect of the present invention, a liquid crystal display device includes: a plurality of gate lines and a plurality of data lines including odd lines and even lines; an electrostatic discharge protection circuit electrically connected between the odd line and the even line; and a common voltage line electrically connected to the electrostatic discharge protection circuit, wherein the electrostatic discharge protection circuit includes a plurality of transistors that are electrically connected to each other, each of the transistor being divided into a transistor area and a connection node area, and wherein each transistor includes: a gate electrode formed on the transistor area and the connection node area; a channel layer formed on a gate electrode of the transistor area; a source/drain electrode pair formed on the channel layer; a first contact hole and a second contact hole that each have a portion overlapping with the gate electrode formed on the connection node area; and a contact part electrically and directly connected to the gate electrode and the source/drain electrode pair through the first contact hole and the second contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention In the drawings.

DETAILED DESCRIPTION OF THE ILLUSTRATED EMBODIMENTS

Reference will now be made in detail to an embodiment of the present invention, an example of which is illustrated in the accompanying drawings. Wherever possible, the same reference numbers will be used throughout the drawings to refer to the same or like parts. The detailed description of known functions or constructions will be omitted where such description does not make clear the subject matter of the embodiment.

In the description hereinafter, it will be understood that, when a layer(or film), a region, a pattern, or a structure is referred to as being "on (above/over/upper)" or "under (below/down/lower)" another substrate, another layer (or film), another region, another pad, or another pattern, it can be directly on the other substrate, layer (or film), region, pad or pattern, or intervening layers may also be present. Furthermore, it will be understood that, when a layer (or film), a region, a pattern, a pad, or a structure is referred to as being "between" two layers (or films), regions, pads or patterns, it can be the only layer between the two layers (or films), regions, pads, or patterns or one or more intervening layers may also be present.

Figure 1:
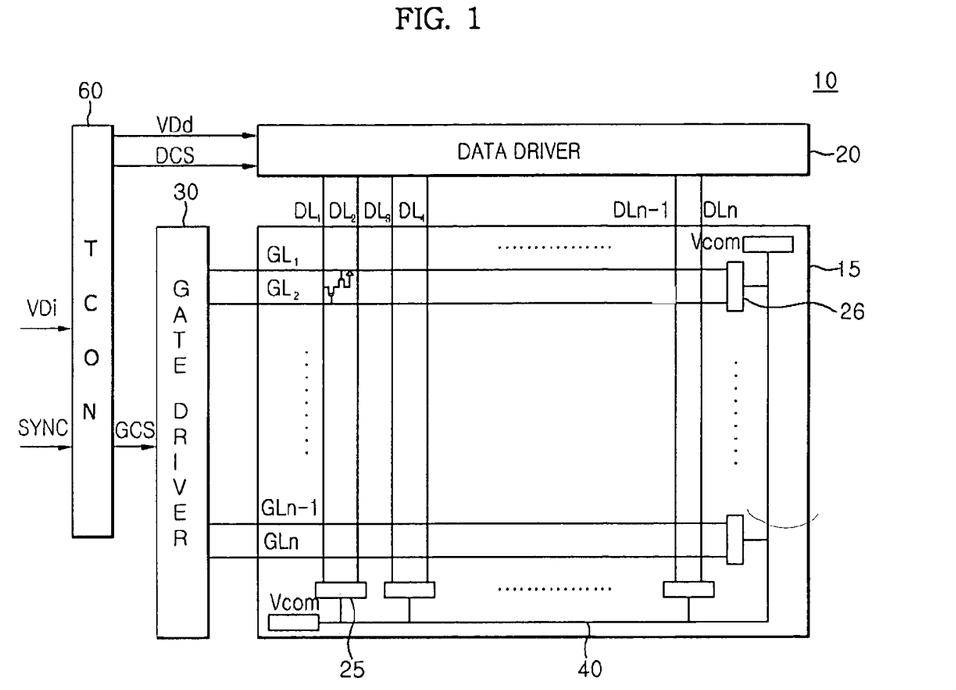
FIG. 1 is a schematic view representing a panel of a liquid crystal display device according to an embodiment of the present invention.

FIG. 1 is a schematic view representing a panel structure of a liquid crystal display device according to an embodiment of the invention.

As shown in FIG. 1, a liquid crystal display device 10 includes a liquid crystal display panel 15 for displaying images, a gate driver 30 and a data driver 20 that are electrically connected to the liquid crystal display panel 15. In addition, the liquid crystal display device 10 includes a timing controller 60 for controlling an operation of the gate driver 30 and the data driver 20.

A plurality of pixel regions, which are defined by the crossings of gate lines GL1 to GLm (hereafter referred to collectively as "GL") with data lines DL1 to DLn (hereafter referred to collectively as "DL"), are arranged in a matrix on the liquid crystal display panel 15, wherein m, n are positive integers. A display area is defined by the pixel regions. That is, the display area includes a plurality of pixel regions. A liquid crystal pixel is formed on each pixel region.

The gate driver 30 sequentially enables a plurality of gate lines GL1 to GLm for a predetermined period (for example, a period of a horizontal synchronizing signal) during a period of a single frame (for example, a period of vertical synchronizing signal). To this end, the gate driver 30 generates a plurality of gate signals. Each gate signal includes a gate enable pulse. The gate enable pulse is sequentially shifted every period of the horizontal synchronizing signal. The gate enable pulse may have a width identical to the period of the horizontal synchronizing signal. The gate enable pulses are generated once in each period of the frame with respect to the gate lines. The gate driver 30 responds to gate control signals GCS output from the timing controller 60 to generate the gate signals. The gate control signal GCS includes a gate start pulse GSP, at least one gate shift clock GSC and gate output enable GOE. The gate start pulse GSP maintains a predetermined logic value (for example, a high logic value) corresponding to a single period of the horizontal synchronizing signal based on a start point of the frame.

The data driver 20 transmits pixel data signals VDd corresponding in number to the number of the data lines DL1 to DLm (that is, the number of the liquid crystal pixels arranged on a single gate line) whenever one of the gate lines GL1 to GLm is enabled. The pixel data signals VDd for a single gate line are provided to the liquid crystal pixels on the liquid crystal display panel 15, respectively, using the corresponding data lines DL. The liquid crystal pixel arranged on the gate line GL allows light corresponding to a voltage level of the pixel data signal VDd to pass therethrough. The data driver 20 receives pixel data signals VDd output from the timing controller 60 and transmits the pixel data signals VDd to each date line in response to the data control signals DCS.

The timing controller 60 receives synchronizing signals SYNC from an external video source (for example, an image demodulation module included in a television receiver or a graphic module included in a computer system). The synchronizing signal SYNC includes a data clock signal (Dclk), a data enable signal (DE), a horizontal synchronizing signal (Hsync) and a vertical synchronizing signal (Vsync). The timing controller 60 generates the gate control signals GCS using the synchronizing signal SYNC. The gate control signals GCS allow the gate driver 30 to generate the gate signals for sequentially scanning the gate lines GL on the liquid crystal display panel 15 for every frame. In addition, the timing controller 60 generates the data control signals DCS. The data control signals DCS allow the data driver 20 to input the pixel data signal VDd for the single line at every period of enabling the gate lines GL, and to output an analog type pixel data voltage which is converted from the pixel data voltage VDd for the single line that is sequentially input. In addition, the timing controller 60 receives a pixel data stream VDi divided by a frame unit (an image unit) from the video source. The timing controller 60 divides the pixel data stream VDi for a single frame into pixel data signals VDd, and then sends the pixel data signals VDd to the data driver 20.

First electrostatic discharge protection circuits 26 and second electrostatic discharge protection circuits 25 are disposed at end portions of the gate lines GL1 to GLm and the data lines DL1 to DLn, respectively. Each of the first electrostatic discharge protection circuits 26 is disposed at end portions of an odd gate line and an even gate line that are adjacent to each other. Each of the second electrostatic discharge protection circuits 25 is disposed at end portions of an odd data line and an even data line that are adjacent to each other. In addition, the first electrostatic discharge protection circuits 26 and the second electrostatic discharge protection circuits 25 are electrically connected to a common voltage line 40, which is disposed along a periphery (non-display area) of the liquid crystal display panel 15.

Accordingly, if static electricity is applied to the gate lines GL1 to GLm and the data lines DL1 to DLn of the liquid crystal display panel 15, the gate lines GL1 to GLm and the data lines DL1 to DLn may have electric potential equal to that of the common voltage line 40 by the first electrostatic discharge protection circuit 26 and the second electrostatic discharge protection circuit 25, thereby protecting inner elements and signal lines.

Figure 2:
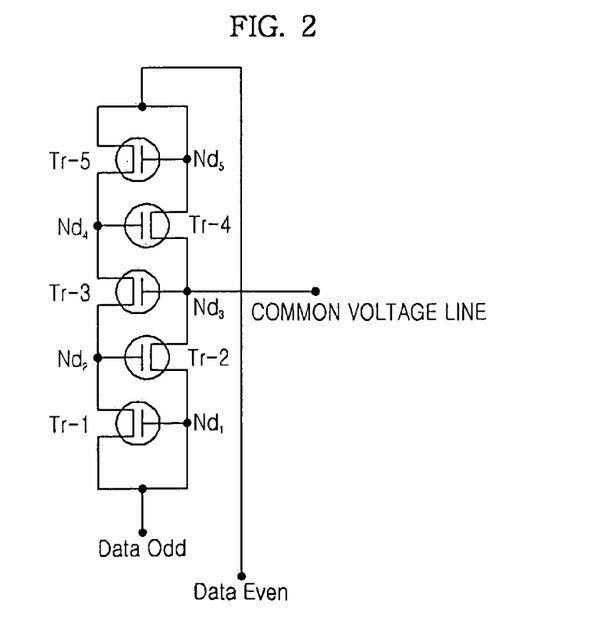
FIG. 2 is a circuit diagram representing an electrostatic discharge protection circuit formed at an end of a data line of the liquid crystal display panel according to an embodiment of the present invention.
Figure 3:
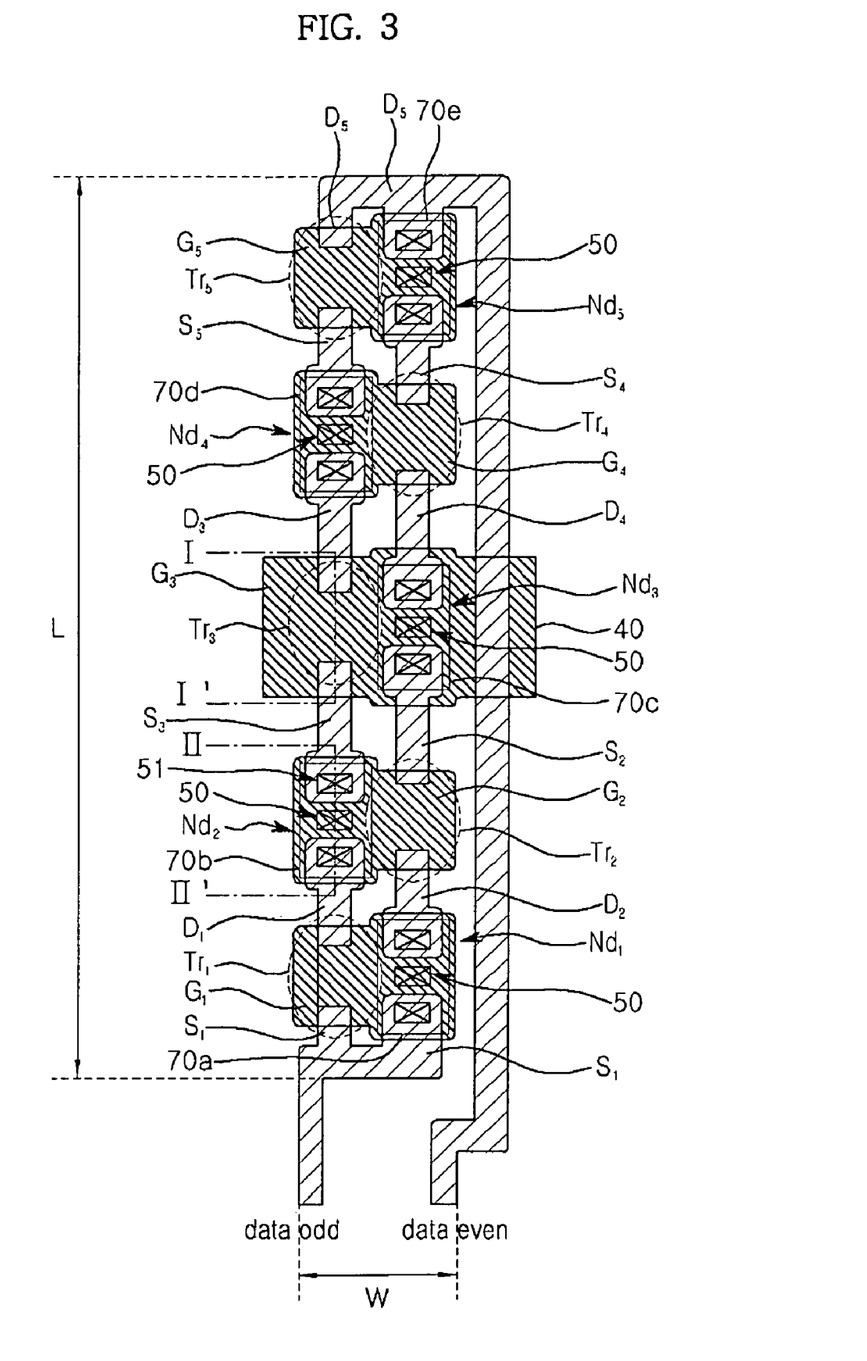
FIG. 3 is a view representing the electrostatic discharge protection circuit of FIG. 2, which is formed on an array substrate of the liquid crystal display panel.

FIG. 2 is a circuit diagram representing the electrostatic discharge protection circuit formed at end portions of the data lines of liquid crystal display panel according to an embodiment of the present invention, and FIG. 3 is a view representing the electrostatic discharge protection circuit of FIG. 2, which is formed on an array substrate of the liquid crystal display panel.

As shown in FIGS. 2 and 3, the electrostatic discharge protection circuit according to the present invention includes five transistors Tr-1, Tr-2, Tr-3, Tr-4, and Tr-5. Although the following description is focused on the electrostatic discharge protection circuits disposed at end portions of the data lines DL1 to DLn, the electrostatic discharge protection circuits disposed at the end portions of the gate lines GL1 to GLm have the same structure. In addition, although the electrostatic discharge protection circuit is illustrated in the drawings as including five transistors, the present invention is not limited thereto and the electrostatic discharge protection circuit may include at least two transistors.

In the second electrostatic discharge protection circuit 25, a source electrode S1 and a gate electrode G1 of the first transistor Tr-1 and a drain electrode D2 of the second transistor Tr-2 are connected to a first connection node Nd1 at the end portion of the odd data line DL2n+1, where n is an integer. A drain electrode D5 and a gate electrode G5 of the fifth transistor Tr-5 and a source electrode S4 of the fourth transistor Tr-4 are connected to a fifth connection node Nd5 at the end portion of the even data line DL2n. The source electrode S1 of the first transistor Tr-1 is divided into two sections in parallel to each other, and the drain electrode D5 of the fifth transistor Tr-5 is divided into two sections in parallel to each other, at the end portion of the odd data line DL2n+1 and the even data line DL2n. One section of the source electrode S1 serves as an electrode of the first transistor Tr-1 and the other section of the source electrode S1 serves as a connection part of the first connection node Nd1. Similarly, one section of the drain electrode D5 serves as an electrode of the fifth transistor Tr-5 and the other section of the drain electrode D5 serves as a connection part of the fifth connection node Nd5.

In addition, a gate electrode G3 of the third transistor Tr-3 disposed in the middle of the electrostatic discharge protection circuit 25 is commonly connected to a third connection node Nd3 together with the common voltage line 40, a source electrode S2 of the second transistor Tr-2 and a drain electrode D4 of the fourth transistor Tr-4. A gate electrode G2 of the second transistor Tr-2 is commonly connected to a second connection node Nd2 together with a drain electrode D1 of the first transistor Tr-1 and a source electrode S3 of the third transistor Tr-3. A gate electrode G4 of the fourth transistor Tr-4 is commonly connected to a fourth connection node Nd4 together with a drain electrode D3 of the third transistor Tr-3 and a source electrode S5 of the fifth transistor Tr-5.

According to the present invention, to reduce a width W and a length L of each transistor of the electrostatic discharge protection circuit, the source/drain electrode pairs of the first, second, third, fourth and fifth transistors Tr-1, Tr-2, Tr-3, Tr-4 and Tr-5 are disposed in parallel to each other between the odd data line and the even data line adjacent to the odd data line.

That is, as shown in FIG. 3, the source/drain electrode pairs S1/D1, S3/D3 and S5/D5 of the first, third and fifth transistors Tr-1, Tr-3 and Tr-5 are parallel to the source/drain electrode pairs S2/D2 and S4/D4 of the second and fourth transistors Tr-2 and Tr-4. In addition, the second connection node Nd2 and the fourth connection node Nd4 are formed on the gate electrode G2 of the second transistor Tr-2 and the gate electrode G4 of the fourth transistor Tr-4, respectively. The first, third, and fifth connection nodes Nd1, Nd3 and Nd5 are formed on the gate electrode G1 of the second transistor Tr-1, the gate electrode G3 of the third transistor Tr-3 and the gate electrode G5 of the fifth transistor Tr-5, respectively.

Accordingly, first contact holes 50 are formed in the first to fifth connection nodes Nd1, Nd2, Nd3, Nd4 and Nd5 such that the first to fifth connection nodes Nd1, Nd2, Nd3, Nd4 and Nd5 are electrically connected to the gate electrodes G1, G2, G3, G4 and G5 formed below the first to fifth connection nodes Nd1, Nd2, Nd3, Nd4 and Nd5. In addition, contact parts 70a, 70b, 70c, 70d and 70e allow the source/drains electrode pairs S1/D1, S2/D2, S3/D3, S4/D4 and S5/D5 to be electrically connected to the gate electrodes G1, G2, G3, G4 and G5 adjacent to the source/drains electrode pairs S1/D1, S2/D2, S3/D3, S4/D4 and S5/D5. In addition, the first, second, third, fourth and fifth gate electrodes G1, G2, G3, G4 and G5 of the first, second, third, fourth and fifth transistors Tr-1, Tr-2, Tr-3, Tr-4, and Tr-5 are electrically isolated from each other. Each of the gate electrodes G1 to G5 has a width substantially identical to or smaller than an interval between the odd data line DL2N+1 and the even data line DL2n that are adjacent to the odd data line DL2N+1.

As described above, according to the present invention, the connection nodes electrically connected to the transistors of the electrostatic discharge protection circuit are formed between the two data lines. The gate electrode of the electrostatic discharge protection circuit according to the present invention has a width in a range of about 30 µm to 50 µm. Accordingly, the electrostatic discharge protection circuit has a width W of about 30 µm~50 µm.

In addition, according to the present invention, since the connection nodes of the transistor for forming the electrostatic discharge protection circuit are formed on the gate electrodes of the respective transistor, the electrostatic discharge protection circuit can be formed in a small space.

Figure 4:
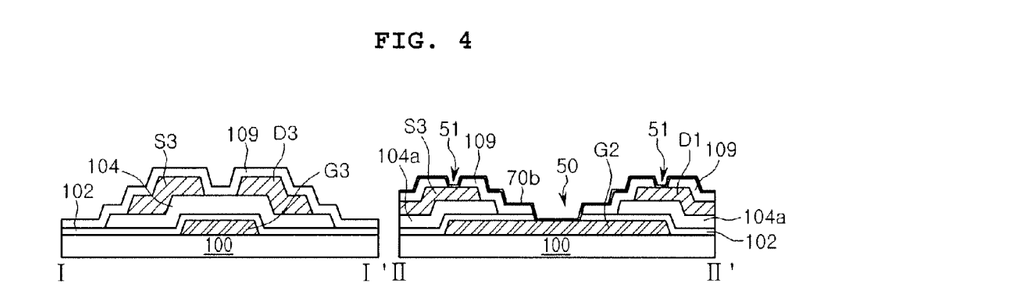
FIG. 4 is a sectional view taken along I-I' line and II-II' line shown in FIG. 3.

FIG. 4 is a sectional view taken along I-I' line and II-II' line shown in FIG. 3.

As shown in FIG. 4, the I-I' sectional view illustrates a cross section of the source/drain electrode pair S3/D3 in an area of the third transistor Tr-3 shown in FIG. 3. The II-II' sectional view represents a cross section of the second connection node in an area of the second transistor Tr-2 shown in FIG. 3.

Firstly, in the region having the third transistor Tr-3, the gate electrode G3 is formed on a substrate 100. A channel layer 104 is formed on the gate electrode G3 while interposing a gate insulating layer 102 therebetween. The source/drain electrode pair S3/D3 is formed on the channel layer 104, and a protection layer 109 is formed on the source/drain electrode pair S3/D3. The gate electrode G3 is integrally formed with the common voltage line 40.

In a region of the second connection node Nd2 of II-II section, the gate insulating layer 102 is formed on the gate electrode G2 of the second transistor Tr-2. The drain electrode D1 of the first transistor Tr-1 and the source electrode S3 of the third transistor Tr-3 are formed on the gate insulating layer 102 while interposing the first contact hole 50 therebetween. A channel layer pattern 104a is formed below the drain electrode D1 of the first transistor Tr-1 and the source electrode S3 of the third transistor Tr3.

In addition, the protection layer 109 is formed on the drain electrode D1 of the first transistor Tr-1 and the source electrode S3 of the third transistor Tr-3. A second contact hole 51 is formed on the protection layer 109. The drain electrode D1 of the first transistor Tr-1 and the source electrode S3 of the third transistor Tr-3 are electrically connected to the gate electrode G2 of the second transistor Tr-2 through the first contact hole 50 and the second contact hole 51 by the contact part 70b that includes material identical to that of a pixel electrode of the liquid crystal display device.

Therefore, according to the present invention, since the connection node of the transistor used for the electrostatic discharge protection circuit is formed on the gate electrode of the transistor, a width and a length of the electrostatic discharge protection circuit is minimized. According to the present invention, the electrostatic discharge protection circuit may have the width within the interval between the odd data line and the even data line that are adjacent to each other.

In addition, although the embodiment has been described such that the electrostatic discharge protection circuit is formed between an odd data line and an even data line for purposes of illustration, the electrostatic discharge protection circuit can be identically formed between an odd gate line and an even gate line in accordance with the invention.

FIGS. 5A to 5D are sectional views representing a process of manufacturing the liquid crystal display device according to the present invention.

In particular, although the embodiment has been described as a process of manufacturing the electrostatic discharge protection circuit, the array substrate of the liquid crystal display device in accordance with the invention can be manufactured simultaneously or concurrently with the electrostatic discharge protection circuit. Accordingly, the process of manufacturing the electrostatic discharge protection circuit will be described in detail.

Figure 5A:
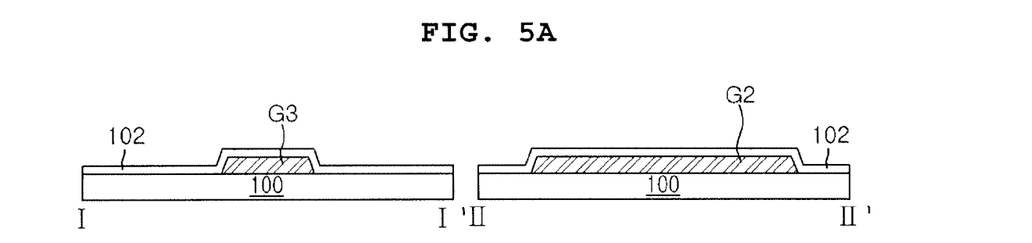
FIGS. 5A to 5D are sectional views representing a process of manufacturing the liquid crystal display device according to the present invention.

As shown in FIG. 5A, the gate electrode G3 is formed on the substrate 100 corresponding to the region of the third transistor Tr-3. The second gate electrode G2 of the second transistor Tr-2, which is electrically isolated from the gate electrode G3, is formed on substrate 100 corresponding to the region of the second connection node Nd2. The gate electrode G3 of the third transistor Tr-3 serves as a part of the common voltage line 40. That is, when the common voltage line 40 is formed, the third gate electrode G3 of the third transistor Tr-3 is also formed.

That is, after a metal layer is deposited on the substrate 100, a photolithography process and an etching process including a mask process are performed, so that the gate lines and the gate electrodes extending from the gate lines are formed on the array substrate of the liquid crystal display device.

After the gate electrodes G3 and G2 are formed on the substrate 100, the gate insulating layer 102 is formed on the entire area of the substrate 100.

Figure 5B:
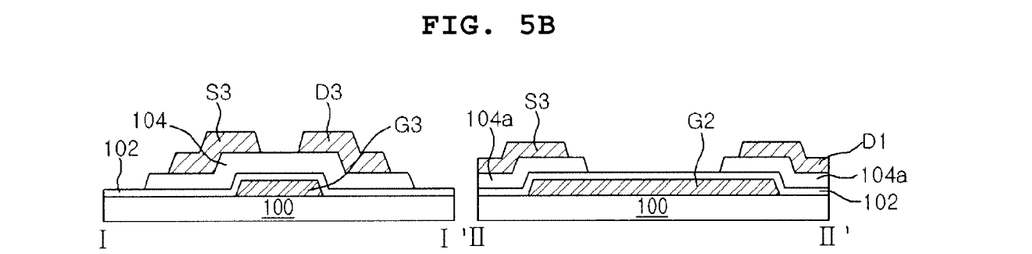

As shown in FIG. 5B, the channel layer 104 consisting an amorphous silicon layer and a doped amorphous silicon layer doped with n+ or p+ impurities is formed on the substrate 100. Subsequently, a metal layer for forming the source and drain electrodes is formed. A photolithography process and an etching process including a mask process are performed to simultaneously form the source/drain electrode pair S3/D3 and the channel layer 104. According to the I-I' sectional view of FIG. 5B, the source/drain electrode pair S3/D3 of the third transistor Tr-3 and the channel layer 104 are formed on the electrostatic discharge protection circuit of the liquid crystal display device. A thin film transistor is formed on each pixel region of the array substrate of the liquid crystal display device, and a source/drain electrode pair and a channel layer of the thin film transistor are simultaneously formed. The data lines of the array substrate are formed simultaneously with the source/drain electrodes and the channel layer.

A region of the second connection node Nd2 of the II-II' section overlaps with a portion of the drain electrode D1 of the first transistor Tr-1 and a portion of the source drain electrode S3 of the third transistor Tr-3 that are adjacent to the second connection node Nd2. As the source and drain electrodes and the channel layer are simultaneously formed through a 4-mask process, the channel layer pattern 104a exists below the drain electrode D1 of the first transistor Tr-1 and the source electrode S3 of the third transistor Tr-3.

Figure 5C:
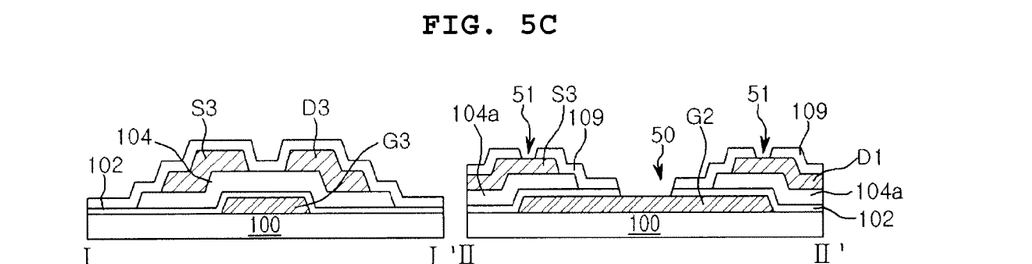

As shown in FIG. 5C, after the source/drain electrode pair S3/D3 have been formed on the substrate 100, and the protection layer 109 is formed on the entire area of the substrate 100. A process of forming the contact hole is performed through the photolithography process and the etching process by using the mask. According to the present invention, since the connection node of the transistor formed on the electrostatic discharge protection circuit is formed on the gate electrode of the transistor of the electrostatic discharge protection circuit, the contact holes are formed in the source/drain electrodes and the gate electrode respectively. The contact holes overlap with the region of the connection node.

Referring to the II-II' section shown in FIG. 5C, the gate electrode G2 of the second transistor Tr-2 of the electrostatic discharge protection circuit is formed on the substrate 100. The drain electrode D1 of the first transistor Tr-1 and the source electrode S3 of the third transistor Tr-3, which are adjacent to each other, are formed on two sides of the gate electrode G2. The first contact hole 50 is formed such that the gate electrode G2 is exposed between the drain electrode D1 of the first transistor Tr-1 and the source electrode S3 of the third transistor Tr-3. The contact hole 51 may be formed by selectively etching both the passivation layer and the gate insulation layer 102 after forming the protection layer or by etching the gate insulation layer 102 and the protection layer 109 in separate processes. The second contact hole 51 is formed in the drain electrode D1 of the first transistor Tr-1 and the source electrode S3 of the third transistor Tr-3.

Although not shown in the drawings, after the protection layer 109 has been formed on the array substrate of the liquid crystal display device, a contact hole is formed to expose a portion of the drain of the thin film transistor formed on the pixel region, a pad area of the gate line and a pad area of the data line.

After the process of forming the contact hole is completed as described above, as shown in FIG. 5D, the contact part 70*b* is formed through the photolithography process and the etching process including the mask process such that the drain electrode D1 of the first transistor Tr-1 and the source electrode S3 of the third transistor Tr-3 are electrically connected to the gate electrode G2 of the second transistor Tr-2.

Figure 5D:
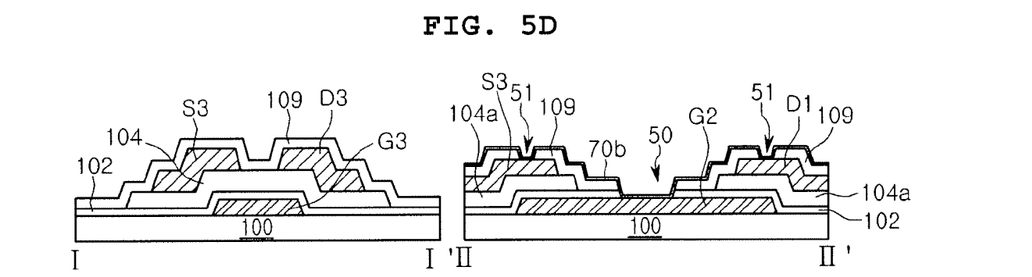

The contact part 70*b* includes transparent insulating material and is formed simultaneously with the pixel electrode in the process of forming the pixel electrode on the array substrate of the liquid crystal display device. As a result, the pixel electrode is formed on the pixel regions aligned on the array substrate of the liquid crystal display device, and the pixel electrode is electrically connected with the drain electrode of the thin film transistor formed on the pixel region.

According to the present invention, the connection nodes of the transistors used for the electrostatic discharge protection circuit are disposed on the gate electrodes of the transistors. The contact part is formed in parallel to the source/drain electrode pair of the transistor formed on the connection node.

As described above in detail, according to the present invention, the width and the length of the electrostatic discharge protection circuit is reduced by modifying a connection structure of the electrostatic discharge protection circuit which is formed on the signal lines including the gate lines, the data lines and the common voltage lines of the liquid crystal display panel.

In addition, according to the present embodiment, the contact hole is formed in the connection node area of the transistors used for the electrostatic discharge protection circuit, such that the connection node is directly connected to the source/drain electrode adjacent to the connection node.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. An electrostatic discharge protection circuit comprising:
   a plurality of odd signal lines;
   a plurality of even signal lines between the odd signal lines;
   a common voltage line;
   a plurality of gate electrodes connected to adjacent odd and even signal lines and the common voltage line;
   source/drain electrode pairs each disposed on a respective one of the gate electrodes to form a plurality of transistors; and
   connection nodes parallel to the source/drain electrode pairs, each connection node adjacent to a respective one of the source/drain electrodes pairs and on a respective one of the gate electrodes,
   wherein each of the connection nodes include a contact part directly connected to the source/drain electrode pair of an adjacent transistor and the gate electrode formed below the source/drain electrode pair through first and second contact holes.

2. The circuit according to claim 1, wherein the gate electrodes are electrically isolated from each other.

3. The circuit according to claim 1, wherein the signal lines include gate lines.

4. The circuit according to claim 1, wherein the signal lines include data lines for transmitting a signal.

5. The circuit according to claim 1, wherein one of the gate electrodes is electrically connected to a common voltage line.

6. The device according to claim 1, wherein the gate electrodes have a width identical to or smaller than an interval between the odd signal line and the even signal line.

7. A method of manufacturing an electrostatic discharge protection circuit, the method comprising:
   forming a plurality of gate electrodes isolated from each other, wherein the gate electrodes are formed on regions of a plurality of transistors and regions of a plurality of connection nodes;
   forming a gate insulating layer on the gate electrodes;
   forming a channel layer on the gate insulating layer;
   forming a plurality of source/drain electrode pairs each respectively corresponding to one of the gate electrodes on the channel layer in the regions of the plurality of transistors;
   forming a protection layer on the substrate and then patterning the protection layer to expose the source/drain electrode pairs at the regions of the plurality of the connection nodes;
   forming a first contact hole and a second contact hole that each have a portion overlapping with the gate electrode formed on the connection node; and
   forming a plurality of contact parts in the regions of the plurality of connection nodes such that the source/drain electrode pair is electrically connected to the gate electrodes through the first and second contact holes.

8. The method according to claim 7, wherein the gate electrodes, the channel layers and the source/drain electrode pairs form a plurality of transistors.

9. The method according to claim 8, wherein the transistors are electrically connected to each other by the contact parts.

10. A liquid crystal display device comprising:
a plurality of gate lines and a plurality of data lines including odd lines and even lines;
an electrostatic discharge protection circuit electrically connected between the odd line and the even line; and
a common voltage line electrically connected to the electrostatic discharge protection circuit,
wherein the electrostatic discharge protection circuit includes a plurality of transistors that are electrically connected to each other, each of the transistor being divided into a transistor area and a connection node area, and
wherein each transistor includes:
a gate electrode formed on the transistor area and the connection node area;
a channel layer formed on the gate electrode of the transistor area;
a source/drain electrode pair formed on the channel layer;
a first contact hole and a second contact hole that each have a portion overlapping with the gate electrode formed on the connection node area; and
a contact part electrically and directly connected to the gate electrode and the source/drain electrode pair through the first contact hole and the second contact hole.

11. The device according to claim 10, wherein the gate electrodes have a width identical to or smaller than an interval between the odd line and the even line that are adjacent to each other.

12. The device according to claim 10, wherein the gate electrodes are formed between the odd line and the even line that are adjacent to each other.

* * * * *